US008816436B2

(12) United States Patent
Cheng et al.

(10) Patent No.: US 8,816,436 B2
(45) Date of Patent: Aug. 26, 2014

(54) METHOD AND STRUCTURE FOR FORMING FIN RESISTORS

(75) Inventors: Kangguo Cheng, Schnectady, NY (US); Thomas N. Adam, Slingerlands, NY (US); Ali Khakifirooz, San Jose, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 13/472,605

(22) Filed: May 16, 2012

(65) Prior Publication Data

US 2013/0307076 A1   Nov. 21, 2013

(51) Int. Cl.
*H01L 27/12* (2006.01)
*H01L 23/62* (2006.01)
*H01L 29/00* (2006.01)
*H01L 27/06* (2006.01)
*H01L 21/02* (2006.01)

(52) U.S. Cl.
USPC ........... 257/350; 257/358; 257/359; 257/360; 257/363; 257/536; 257/537; 257/538; 257/539

(58) Field of Classification Search
None
See application file for complete search history.

(56) References Cited

U.S. PATENT DOCUMENTS

| 5,296,726 | A | * | 3/1994 | MacElwee | 257/213 |
| 5,851,886 | A | * | 12/1998 | Peng | 438/289 |
| 6,096,591 | A | * | 8/2000 | Gardner et al. | 438/238 |
| 6,720,231 | B2 | | 4/2004 | Fried et al. | |
| 6,758,552 | B1 | * | 7/2004 | Figueredo | 347/59 |
| 7,605,022 | B2 | | 10/2009 | Cha et al. | |
| 7,763,531 | B2 | | 7/2010 | Abadeer et al. | |
| 7,985,639 | B2 | | 7/2011 | Johnson et al. | |
| 8,053,809 | B2 | | 11/2011 | Cheng et al. | |
| 8,058,125 | B1 | | 11/2011 | Lin et al. | |
| 8,076,190 | B2 | | 12/2011 | Chen et al. | |
| 2011/0284967 | A1 | * | 11/2011 | Cheng et al. | 257/368 |

FOREIGN PATENT DOCUMENTS

JP          04028566 A  *  1/1992  .............. B41J 2/335

* cited by examiner

*Primary Examiner* — Steven Loke
*Assistant Examiner* — Juanita B Rhodes
(74) *Attorney, Agent, or Firm* — Joseph P. Abate; Howard M. Cohn (57) ABSTRACT

A fin resistor and method of fabrication are disclosed. The fin resistor comprises a plurality of fins arranged in a linear pattern with an alternating pattern of epitaxial regions. An anneal diffuses dopants from the epitaxial regions into the fins. Contacts are connected to endpoint epitaxial regions to allow the resistor to be connected to more complex integrated circuits.

8 Claims, 10 Drawing Sheets

METHOD AND STRUCTURE FOR FORMING FIN RESISTORS

FIELD OF THE INVENTION

The present invention relates generally to semiconductor fabrication, and more particularly, to a fin resistor and method of fabrication.

BACKGROUND OF THE INVENTION

Transistors, such as metal oxide semiconductor field-effect transistors (MOSFETs), are the core building block of the vast majority of semiconductor devices. Some semiconductor devices, such as high performance processor devices, can include millions of transistors. For such devices, decreasing transistors size, and thus increasing transistor density, has traditionally been a high priority in the semiconductor manufacturing industry.

FinFET technology is becoming more prevalent as device size continues to shrink. In addition to transistors, other devices, including resistors, are required to implement various integrated circuit (IC) designs. It is therefore desirable to have a structure and fabrication process for forming resistors that is compatible with the formation of FinFET structures.

SUMMARY

In one embodiment of the present invention, a fin resistor is provided. The fin resistor comprises a plurality of epitaxial semiconductor regions disposed on a substrate in series with a plurality of fins, arranged in an alternating pattern of epitaxial semiconductor regions and fins. An epitaxial semiconductor region from the plurality of epitaxial semiconductor regions forms a first endpoint and a second endpoint for the alternating pattern. Each of the plurality of epitaxial semiconductor regions has a first resistance and each of the plurality of fins has a second resistance, wherein the first resistance is different than the second resistance.

In another embodiment of the present invention, a method of forming a fin resistor is provided. The method comprises forming a plurality of fins on a substrate. The plurality of fins are linearly arranged with a space between each fin and a neighboring fin. The method includes forming a plurality of in-situ doped epitaxial semiconductor regions on the substrate adjacent to each of the plurality of fins. Dopants are present in the epitaxial semiconductor regions and an epitaxial semiconductor region from the plurality of in-situ doped epitaxial semiconductor regions forms a first endpoint and a second endpoint. The method further includes forming a first contact on the first endpoint, and forming a second contact on the second endpoint.

In another embodiment of the present invention, a method of forming a semiconductor structure comprising a fin resistor is provided. The method comprises forming a plurality of fins on an insulator layer of a substrate, in which the plurality of fins are linearly arranged with a space between each fin and a neighboring fin, forming a plurality of in-situ doped epitaxial semiconductor regions on the insulator layer adjacent to each of the plurality of fins, whereby dopants are present in the epitaxial semiconductor regions, and performing an anneal to diffuse dopants from the epitaxial semiconductor regions into the plurality of fins, and controlling a resistance value for the resistor by setting the fin thickness to a predetermined value.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

DETAILED DESCRIPTION

Figure 1A:
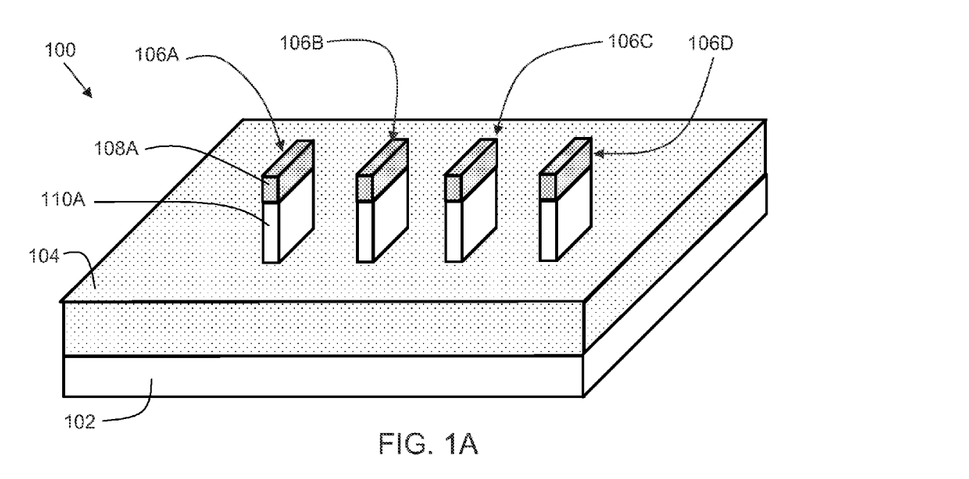
FIG. 1A is a perspective view of a semiconductor structure at a starting point for a method in accordance with an embodiment of the present invention.
Figure 1B:
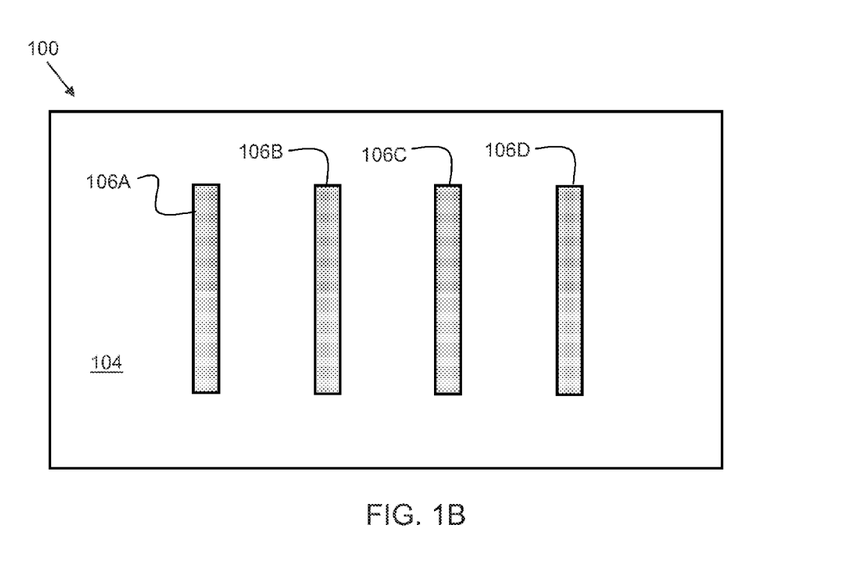
FIG. 1B is a top-down view of the semiconductor structure of FIG. 1A.

FIG. 1A is a perspective view of a semiconductor structure 100 at a starting point for a method in accordance with an embodiment of the present invention. Semiconductor structure 100 comprises a semiconductor layer 102 with a substrate (an insulator layer) 104 disposed thereon. Insulator layer 104 may comprise an oxide layer, and may be a buried oxide layer (BOX) as part of a semiconductor-on-insulator (SOI) structure. A plurality of fins (indicated as 106A, 106B, 106C, and 106D, generally referred to as 106) are formed on the insulator layer 104. The fins 106 are linearly arranged with a space between each fin and a neighboring fin. Each fin is comprised of a fin semiconductor portion 110A and a fin hardmask portion 108A. The fin hardmask portion may be comprised of nitride. Note that for the purpose of clarity in the figure, reference numbers for the fin silicon portion and fin hardmask portion are only shown for fin 106A. However, the other fins (106B, 106C, and 106D) have a similar fin semiconductor portion and fin hardmask portion to that of fin 106A. The fins (referred to generally as 106) may be formed by industry-standard methods, such as, for example, spacer imaging transfer, or other suitable techniques. FIG. 1B is a top-down view of the semiconductor structure 100 of FIG. 1A.

The semiconductor layer 102 may comprise any semiconducting material including, but not limited to silicon (Si), strained Si, SiC, SiGe, SiGeC, Si alloys, Ge, Ge alloys, GaAs, InAs, and InP, or any combination thereof. A portion or entire semiconductor substrate may be amorphous, polycrystalline, or monocrystalline. The semiconductor substrate may be doped, undoped, or contain doped regions and undoped regions therein. Similarly, the fin semiconductor portion 110A may comprise any semiconducting material including, but not limited to silicon (Si), strained Si, SiC, SiGe, SiGeC, Si alloys, Ge, Ge alloys, GaAs, InAs, and InP, or any combination thereof.

Although SOI is shown in FIG. 1A, embodiments of this invention also apply to bulk finFET structures in which fins are formed on a bulk semiconductor substrate instead of SOI.

Figure 2A:
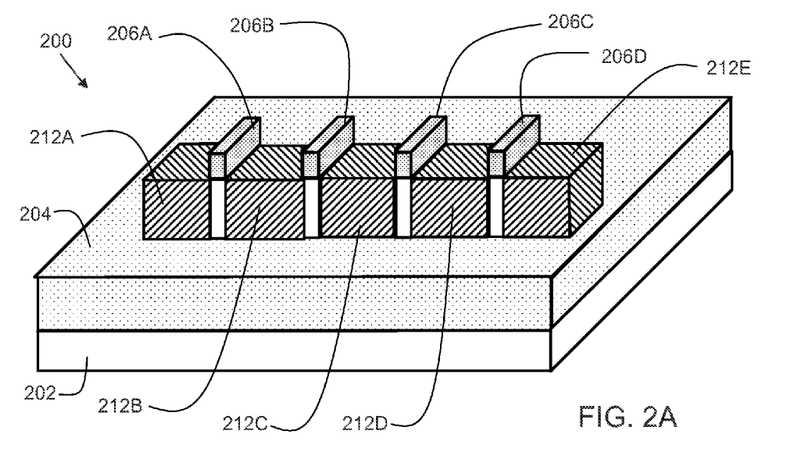
FIG. 2A is a perspective view of a semiconductor structure after a subsequent process step of epitaxial region formation.

FIG. 2A is a perspective view of a semiconductor structure 200 after a subsequent process step of epitaxial region formation. As stated previously, often, similar elements may be referred to by similar numbers in various figures (FIGs) of the drawing, in which case typically the last two significant digits may be the same, the most significant digit being the number of the drawing figure (FIG). Hence, semiconductor layer 202 of FIG. 2 is similar to semiconductor layer 102 of FIG. 1, and insulator layer 204 of FIG. 2 is similar to insulator layer 104 of FIG. 1, for example.

Figure 2B:
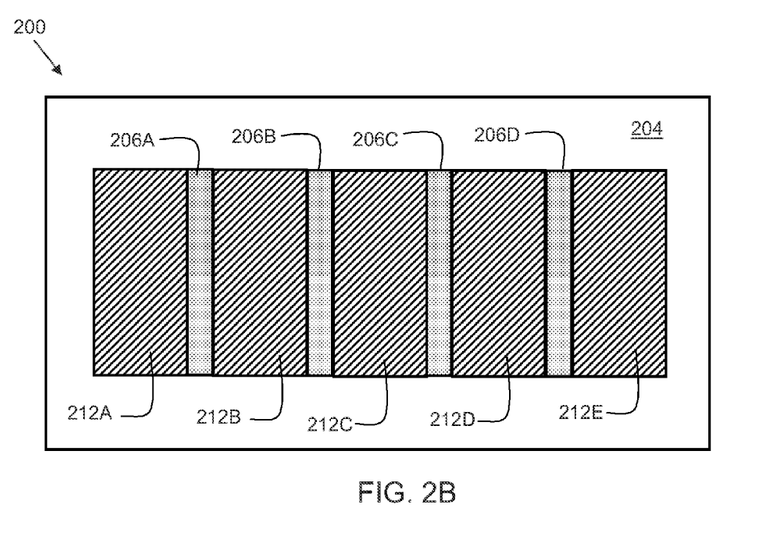
FIG. 2B is a top-down view of the semiconductor structure of FIG. 2A.

The epitaxial regions (212A, 212B, 212C, 212D, and 212E, referred to generally as 212) are comprised of an epitaxially grown semiconductor that may be in-situ doped. The epitaxial regions are arranged in between the fins 206, as to form an alternating pattern of epitaxial semiconductor regions 212 and fins 206. As shown in FIG. 2A, there are four fins, and five epitaxial regions. The alternating pattern of epitaxial semiconductor regions 212 and fins 206 has an epitaxial region at the beginning and at the end of the alternating pattern. In semiconductor structure 200, epitaxial region 212A serves as a first endpoint for the resistor, and epitaxial region 212E serves as a second endpoint for the resistor. In general, for some embodiments, for N fins, there are N+1 epitaxial semiconductor regions. FIG. 2B is a top-down view of the semiconductor structure of FIG. 2A.

Epitaxial semiconductor regions 212 may be in-situ doped with N-type dopants such as arsenic, phosphorous and/or antimony. In alternative embodiments, a P-type dopant (such as boron and indium) may be used instead. At this point, the epitaxial regions 212 have a high concentration of dopants and low resistance, whereas the fins 206, which are undoped, have a very high resistance.

The epitaxial semiconductor regions 212 may be comprised of silicon, silicon germanium, germanium, a compound semiconductor, or any suitable combination of those materials. In an alternative embodiment, the epitaxial regions 212 are comprised of boron doped silicon germanium. In another embodiment, the epitaxial regions 212 are comprised of phosphorous-doped silicon carbon (Si:C).

Figure 3A:
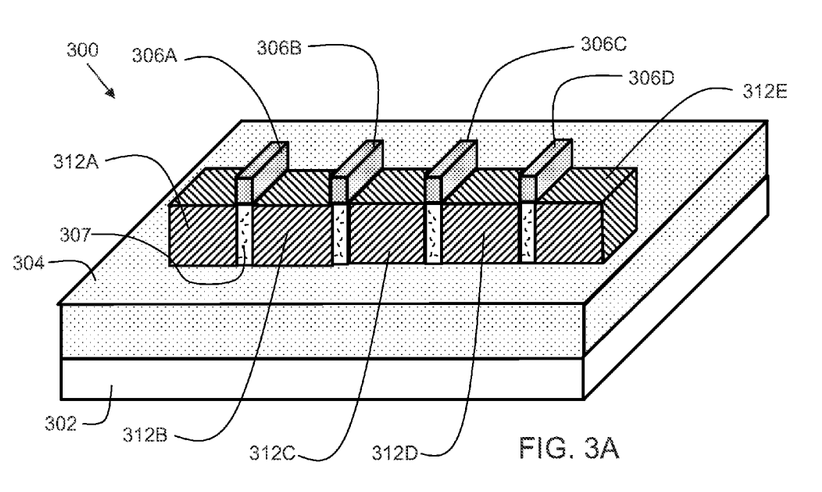
FIG. 3A is a perspective view of a semiconductor structure after a subsequent process step of annealing.

FIG. 3A is a perspective view of a semiconductor structure 300 after a subsequent process step of annealing. The anneal causes dopants 307 to diffuse from the epitaxial regions 312 to the fins 306. The anneal may be a spike anneal, flash anneal, laser anneal, rapid thermal anneal, or any suitable combination of those techniques. Other annealing techniques are also contemplated. In one embodiment, the anneal temperature is in the range of about 900 degrees centigrade to about 1200 degrees centigrade. In one embodiment, the anneal time ranges from about 1 millisecond to about 120 seconds. In some embodiments, dopants may already diffuse into fins during the in-situ doped epitaxial growth process. The anneal process after the epitaxy process is optional, and may be skipped, particularly for fins with a width less than 8 nm.

Note that for the purpose of clarity in the figure, reference number 307 for the diffused dopants is only shown for fin 306A. However, the other fins (306B, 306C, and 306D) have similar diffused dopants as that of fin 306A.

The resistance of the fins decreases as more dopants diffuse into them. Hence, the dopant concentration of the fins is one of the "recipe" parameters that facilitate controlling the resistance value for the resistor shown in semiconductor structure 300. One or more of the parameters may be adjusted to result in a desired resistance value $R_T$ for the resistor. In one embodiment, the plurality of epitaxial semiconductor regions 312 and plurality of fins 306 are doped with N-type dopants. In another embodiment, the plurality of epitaxial semiconductor regions 312 and plurality of fins 306 are doped with P-type dopants. In one embodiment, the plurality of epitaxial semiconductor regions 312 have a dopant concentration ranging from about 1E20 atoms per cubic centimeter to about 2E21 atoms per cubic centimeter, although higher or lower dopant concentrations are possible. In one embodiment, the plurality of fins have a dopant concentration ranging from about 1E18 atoms per cubic centimeter to about 1E20 atoms per cubic centimeter, although higher or lower dopant concentrations are possible.

Figure 3B:
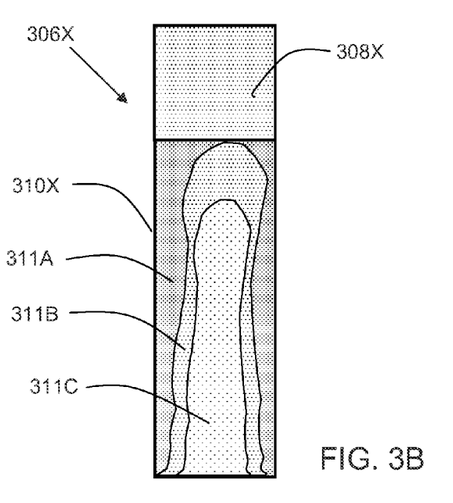
FIG. 3B is a detailed view of a fin in an embodiment of the present invention.

In some embodiments, the dopant concentration in the fins may not be uniform. As shown in FIG. 3B, the dopant concentration of a fin 306X may be higher at the outer portion 311A of the fin that is near to surfaces of the adjacent epitaxial regions (312 of FIG. 3A) than the dopant concentration at the middle portion 311B of the fins. An even lower dopant concentration may be in the interior portion 311C of fin 306X. Hence, the fins may have a non-uniform dopant concentration profile, with the dopant concentration decreasing towards the interior portion of the fin. That is, the dopant concentration in an outer portion of each fin is higher than the dopant concentration in an interior portion of each fin.

Figure 3C:
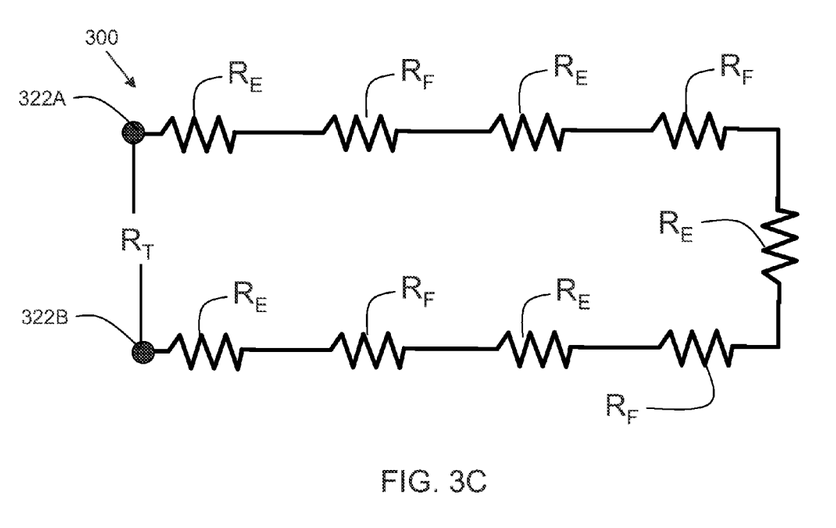
FIG. 3C is a schematic view of the semiconductor structure of FIG. 3A.

FIG. 3C is a schematic view of the semiconductor structure 300 of FIG. 3A. Point 322A represents a point on epitaxial region 312A of FIG. 3A. Point 322B represents a point on epitaxial region 312E of FIG. 3A. The measured resistance $R_T$ between point 322A and point 322B is the sum of the resistance of all the epitaxial regions 312 and all the fin regions 306, as the epitaxial regions 312 and fins 306 can be considered as a plurality of resistances in series. $R_E$ denotes a resistance due to an epitaxial region, and $R_F$ indicates a resistance due to a fin. The values of $R_E$ and $R_F$ depend on the dimensions and dopant concentrations of fins and epitaxial regions. Usually, $R_E$ and $R_F$ have different values. In some embodiments, $R_E < R_F$.

Figure 4A:
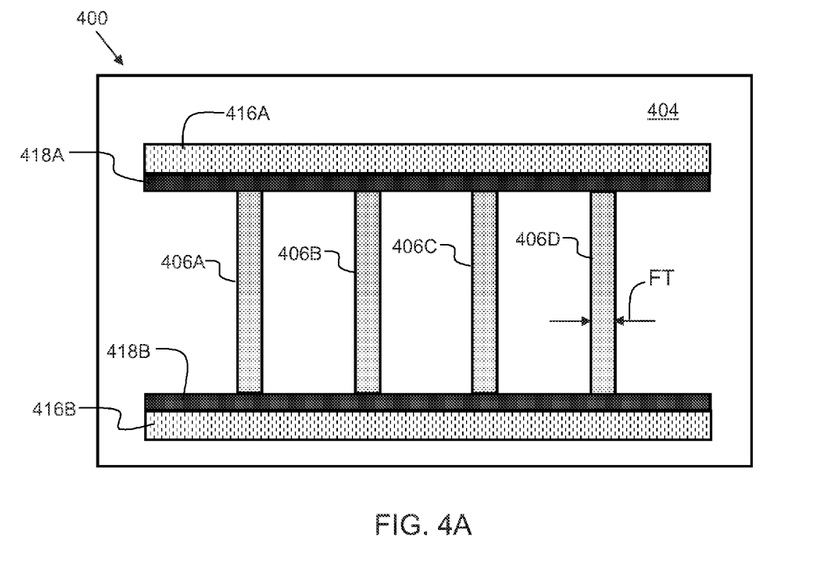
FIG. 4A is a top-down view of a semiconductor structure after a process step of gate region formation for a method in accordance with an alternative embodiment of the present invention.

FIG. 4A is a top-down view of a semiconductor structure 400 after a process step of gate region formation for a method in accordance with an alternative embodiment of the present invention. In this embodiment, gate material regions (416A and 416B, generally 416) are disposed along the pattern of fins, and the gate material regions 416 are oriented perpendicular to the fins 406, and thus, the gate material regions 416 bound the fins 406 on two sides. The gate material regions 416A and 416B may comprise a conductor region which may comprise doped polysilicon, metal, a conductive metallic compound, or any suitable combination of those materials.

A gate spacer layer (418A, 418B, generally 418) is disposed between the gate material regions 416A and 416B, and the fins 406. The gate spacer layer 418 is an insulator, and may be comprised of oxide, nitride, or a combination of oxide and nitride, or any suitable insulator material. The gate material regions for the resistor may be formed at the same step of forming gates in finFET devices also residing on the same chip or die. In some embodiments, the gate material regions are formed after forming the fins and before formation of the epitaxial regions.

The thickness of the fins FT is another recipe parameter for determining the resistance value $R_T$ of the resistor. Thus, by setting the fin thickness FT to a predetermined value, the value $R_T$ of the resistor can be altered to achieve a desired resistance value.

Figure 4B:
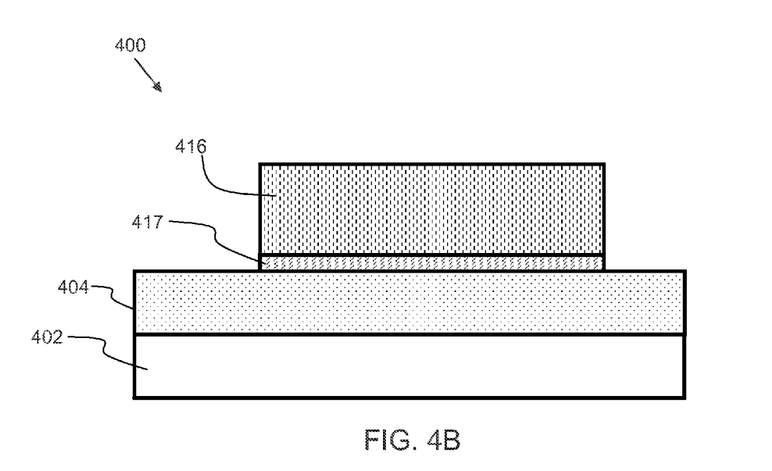
FIG. 4B shows a side view of the semiconductor structure of FIG. 4A.

FIG. 4B shows a side view of semiconductor structure 400. As shown in FIG. 4B, the gate region 416 may further comprise a gate dielectric 417 underneath the conductive gate region 416.

Figure 5:
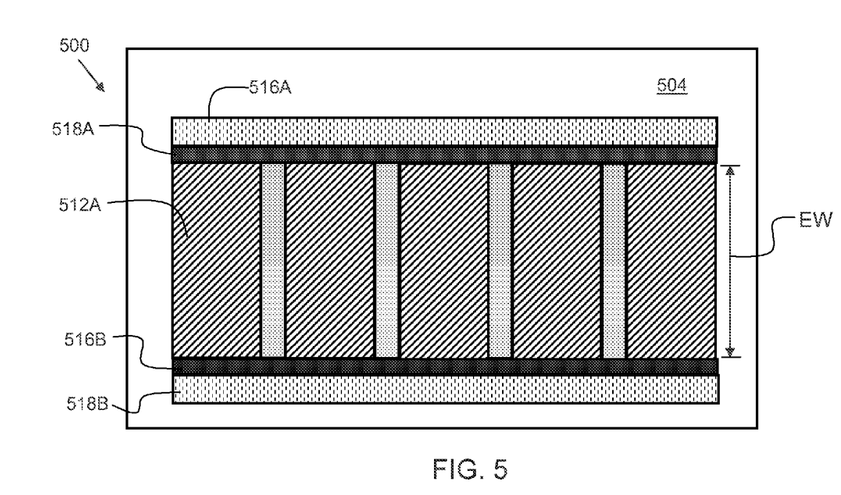
FIG. 5 is a top-down view of a semiconductor structure after a process step of epitaxial region formation for a method in accordance with an alternative embodiment of the present invention.

FIG. 5 is a top-down view of a semiconductor structure 500 after a process step of epitaxial region formation for a method in accordance with an alternative embodiment of the present invention.

A purpose of the gate material regions 516 for the resistor is to have the alternating pattern of epitaxial regions 512 and fins to be bounded by gates 516 so that the width of the resistor EW can be precisely controlled. The width of the resistor EW is another recipe parameter for determining the resistance value $R_T$ of the resistor. Thus, by setting the width of the resistor EW to a predetermined value, the value RT of the resistor can be altered to achieve a desired resistance value.

Figure 6:
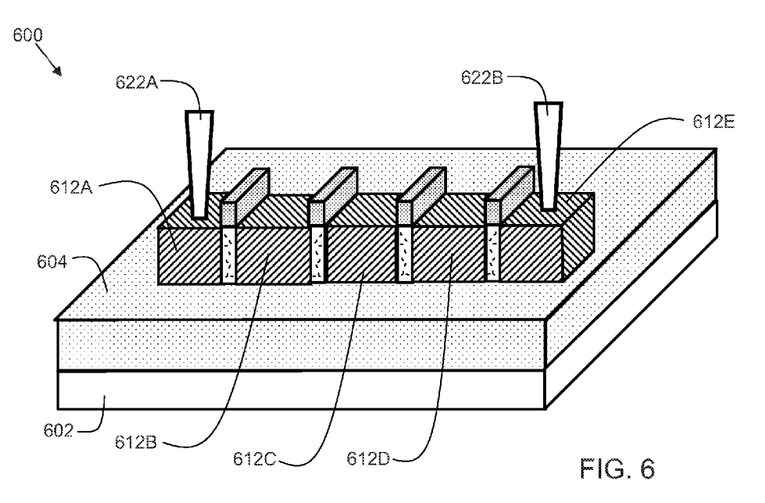
FIG. 6 is a perspective view of a semiconductor structure after a process step of contact formation.

FIG. 6 is a perspective view of a semiconductor structure 600 after a process step of contact formation. Contact 622A corresponds to point 322A of FIG. 3B, and contact 622B corresponds to point 322B of FIG. 3B. The contacts (generally 622) may, in some embodiments, be comprised of tungsten or copper. In general, the contacts may be comprised of any suitable metal or conductor. The contacts 622 provide for connection of the fin resistor of semiconductor structure 600 to other devices within an integrated circuit to implement circuit designs.

Figure 7:
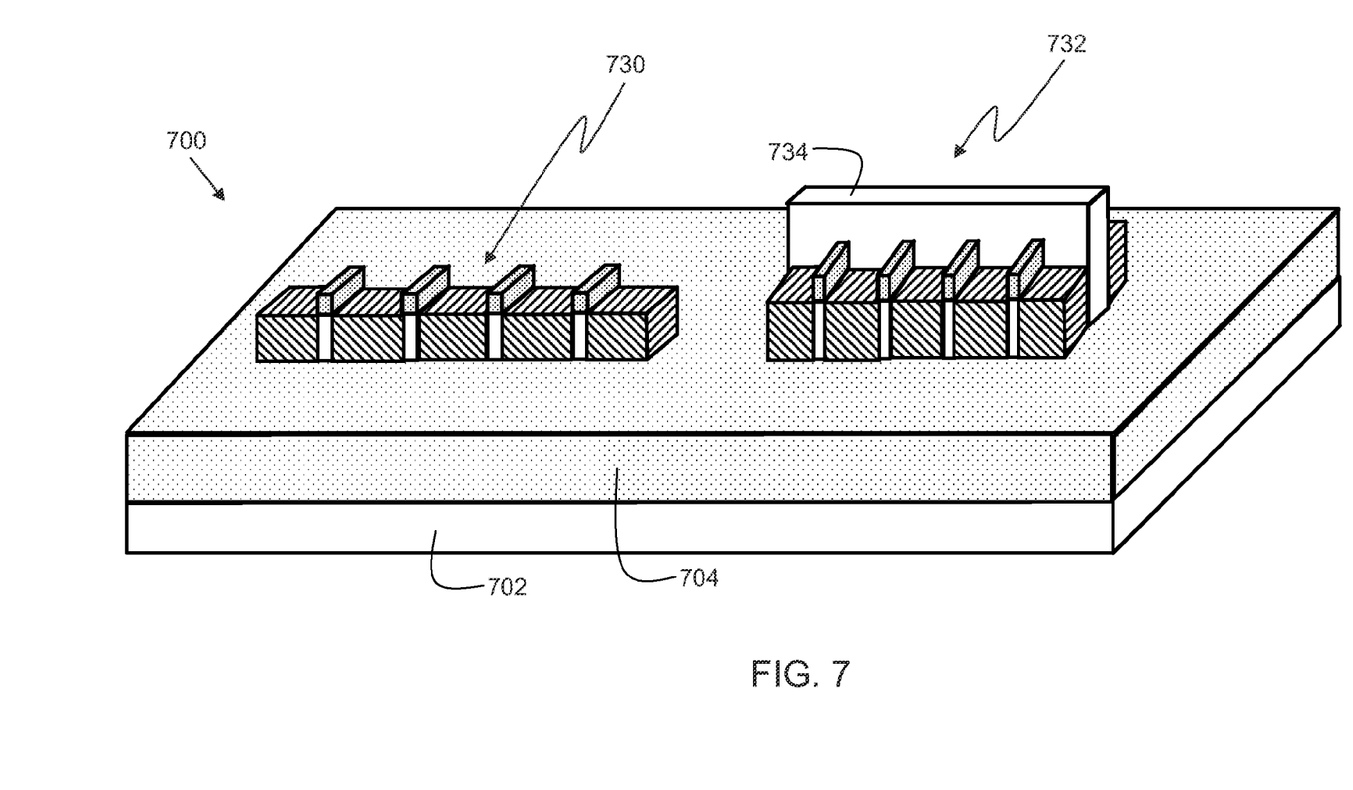
FIG. 7 is a perspective view of a semiconductor structure comprising a resistor and an adjacent finFET.

FIG. 7 is a perspective view of a semiconductor structure 700 comprising a resistor 730 and an adjacent finFET 732. FinFET 732 comprises gate 734 disposed in the alternating pattern of epitaxial layers and fins. Resistor 730 is also comprised of fins and epitaxial regions. In some embodiments, the epitaxial region width (EW of FIG. 5) and fin thickness (FT of FIG. 4A) may be the same for the resistor 730 as that of the FinFET 732. In some embodiments, the epitaxial region width (EW of FIG. 5) and fin thickness (FT of FIG. 4A) may be different for the resistor 730 than that of the FinFET 732. The process steps used to form the finFET 732 may also be used to form the fin resistor 730. For example, during the process step of fin formation, fins for both the resistor 730 and finFET 732 may be formed simultaneously. Similarly, epitaxial regions may be formed simultaneously for both the finFET 732 and the resistor 730. In some embodiments, the same epitaxial process is used to form the epitaxial regions of the resistors and to form the epitaxial source/drain in the finFET transistor region.

Figure 8:
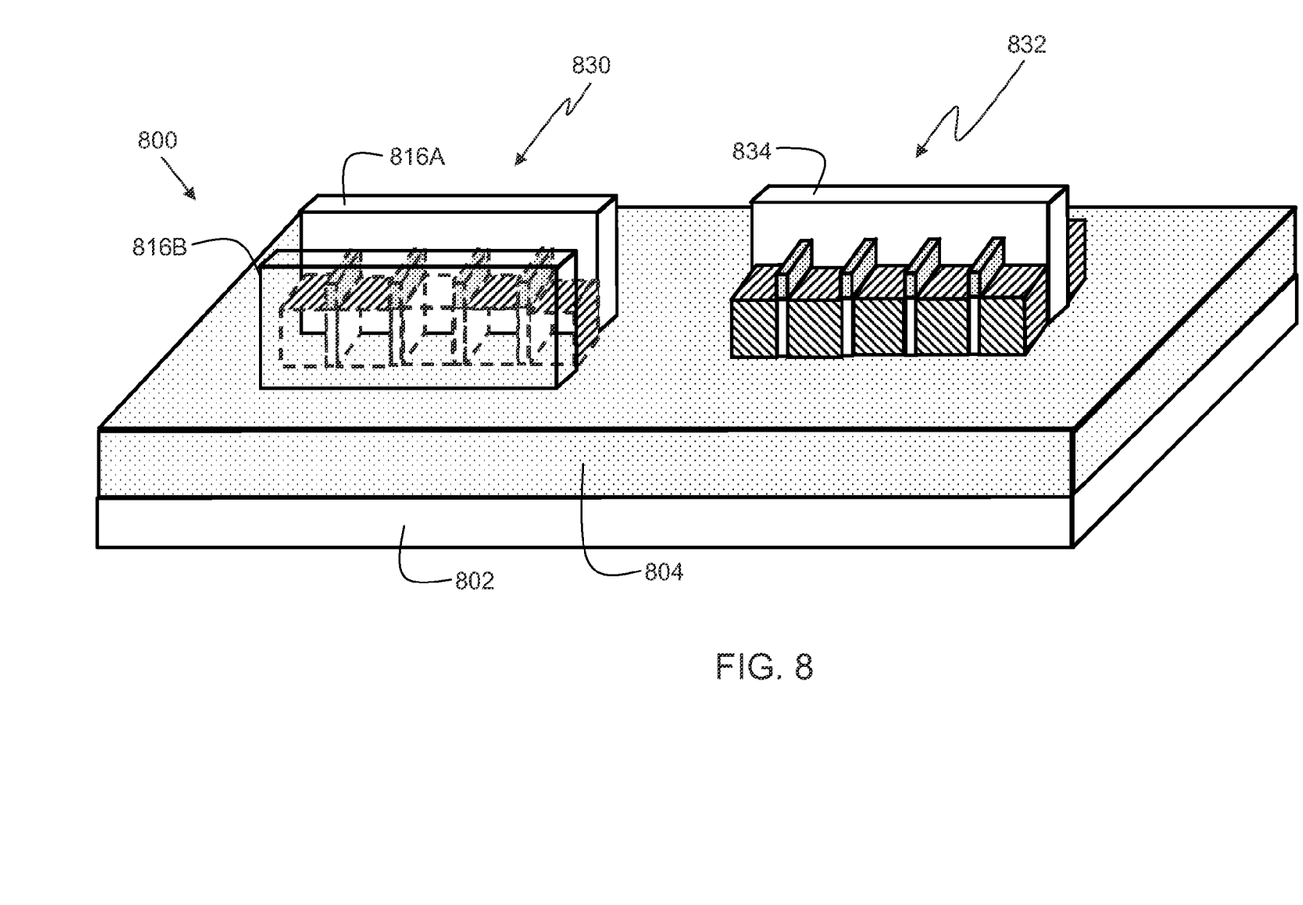
FIG. 8 is a perspective view of an alternative embodiment of a semiconductor structure comprising a resistor and an adjacent finFET.

FIG. 8 is a perspective view of a semiconductor structure 800 comprising a resistor 830 and an adjacent finFET 832. FinFET 832 is similar to finFET 732. However, resistor 830 has optional gate material regions 816A and 816B (compare with 730 of FIG. 7). The gate material regions 816A and 816B may be formed during the same process step that forms gate 834 of finFET 832. The fins and epitaxial regions of resistor 830 are shown in phantom lines behind gate material region 816B.

The process of forming resistor 830 may be performed at the same time as forming finFET 832. The fins, epitaxial regions, and gate material regions of the resistor 830 and finFET 832 may be formed at the same process step for both the resistor and the finFET. Hence, as the resistor formation is fully compatible with finFET CMOS flow, resistors can be formed without incurring time or cost penalties that would be associated with additional process steps.

There are numerous recipe parameters that can be adjusted as part of the fabrication process to control the resistance value $R_T$ of the resistor 830. These parameters include, but are not limited to:

Fin thickness (FT)—increasing FT increases $R_T$
Epitaxial region width (EW)—increasing EW decreases $R_T$
Anneal time—increasing anneal time decreases $R_T$
Anneal temperature—increasing anneal temperature decreases $R_T$
Epitaxial Region Dopant concentration—increasing epitaxial region dopant concentration decreases $R_T$.

Hence, various features and parameters may be adjusted to achieve a desired resistance for a fin resistor in accordance with embodiments of the present invention.

Figure 9:
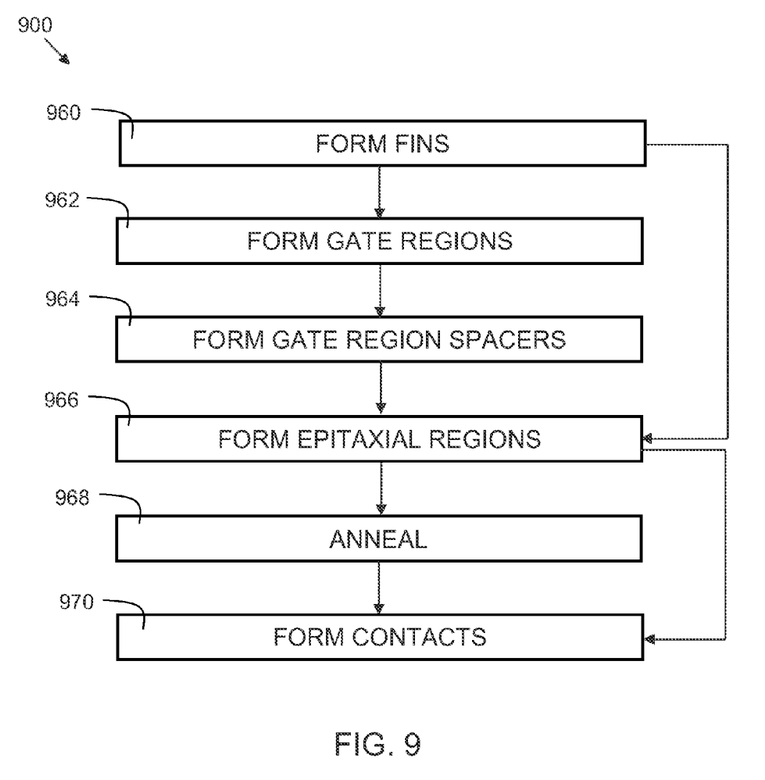
FIG. 9 is a flowchart indicating process steps for a method in accordance with an embodiment of the present invention.

FIG. 9 is a flowchart 900 indicating process steps for a method in accordance with an embodiment of the present invention. In process step 960, fins are formed (see 106 of FIG. 1). In optional process step 962, gate material regions are formed (see 416 of FIG. 4A). If gate material regions are formed in process step 962, then spacers are formed in process step 964 (see 418 of FIG. 4A). In process step 966, epitaxial regions are formed (see 212 of FIG. 2A). In some embodiments, process step 966 may follow from process step 960 without performing process steps 962 and 964. In process step 968, an anneal is performed to diffuse some dopants from the epitaxial regions into the fins (see 306 of FIG. 3A). In process step 970, contacts are formed (see 622A and 622B of FIG. 6). In some embodiments, anneal process step 968 is optional, and process step 970 may follow from process step 966 without performing anneal process step 968.

Figure 10:
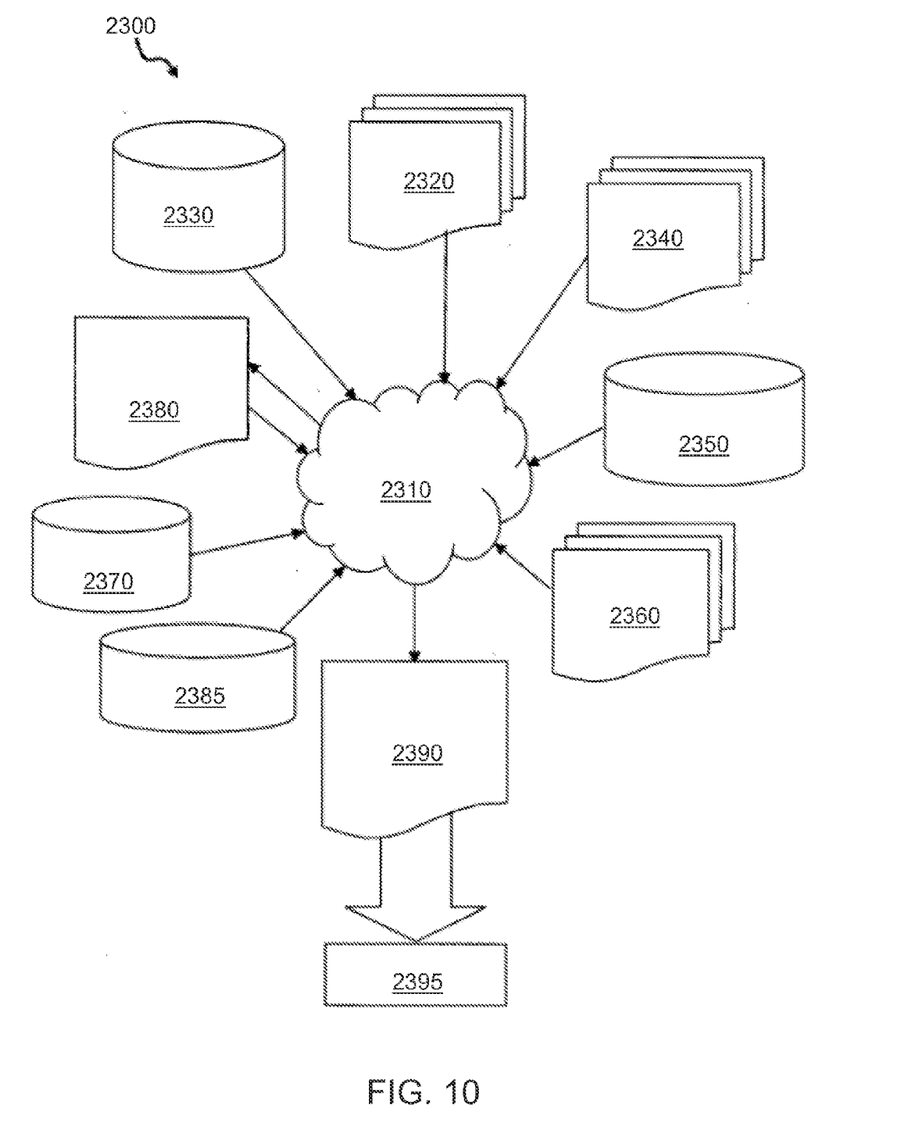
FIG. 10 shows a block diagram of an exemplary design flow.

FIG. 10 shows a block diagram of an exemplary design flow 2300 used for example, in semiconductor IC logic design, simulation, test, layout, and manufacture. Design flow 2300 includes processes, machines and/or mechanisms for processing design structures or devices to generate logically or otherwise functionally equivalent representations of the design structures and/or devices described above and shown in FIGS. 1-9. The design structures processed and/or generated by design flow 2300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 2300 may vary depending on the type of representation being designed. For example, a design flow 2300 for building an application specific IC (ASIC) may differ from a design flow 2300 for designing a standard component or from a design flow 2300 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 2320 that is preferably processed by a design process 2310. Design structure 2320 may be a logical simulation design structure generated and processed by design process 2310 to produce a logically equivalent functional representation of a hardware device. Design structure 2320 may also or alternatively comprise data and/or program instructions that when processed by design process 2310, generate a functional representation of the physical structure of a hardware device. Whether representing functional and/or structural design features, design structure 2320 may be generated using electronic computer-aided design (ECAD) such as implemented by a core developer/designer. When encoded on a machine-readable data transmission, gate array, or storage medium, design structure 2320 may be accessed and processed by one or more hardware and/or software modules within design process 2310 to simulate or otherwise functionally represent an electronic component, circuit, electronic or logic module, apparatus, device, or system such as those shown in FIGS. 1-9. As such, design structure 2320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 2310 preferably employs and incorporates hardware and/or software modules for synthesizing, translating, or otherwise processing a design/simulation functional equivalent of the components, circuits, devices, or logic structures shown in FIGS. 1-9 to generate a Netlist 2380 which may contain design structures such as design structure 2320. Netlist 2380 may comprise, for example, compiled or otherwise processed data structures representing a list of wires, discrete components, logic gates, control circuits, I/O devices, models, etc. that describes the connections to other elements and circuits in an integrated circuit design. Netlist 2380 may be synthesized using an iterative process in which netlist 2380 is resynthesized one or more times depending on design specifications and parameters for the device. As with other design structure types described herein, netlist 2380 may be recorded on a machine-readable data storage medium or programmed into a programmable gate array. The medium may be a non-transitory, non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 2310 may include using a variety of inputs; for example, inputs from library elements 2330 which may house a set of commonly used elements, circuits, and devices, including models, layouts, and symbolic representations, for a given manufacturing technology (e.g., different technology nodes, 32 nm, 45 nm, 90 nm, etc.), design specifications 2340, characterization data 2350, verification data 2360, design rules 2370, and test data files 2385 (which may include test patterns and other testing information). Design process 2310 may further include, for example, standard circuit design processes such as timing analysis, verification, design rule checking, place and route operations, etc. One of ordinary skill in the art of integrated circuit design can appreciate the extent of possible electronic design automation tools and applications used in design process 2310 without deviating from the scope and spirit of the invention. The design structure of the invention is not limited to any specific design flow.

Design process 2310 preferably translates an embodiment of the invention as shown in FIGS. 1-9, along with any additional integrated circuit design or data (if applicable), into a second design structure 2390. Design structure 2390 resides on a storage medium in a data format used for the exchange of layout data of integrated circuits (e.g. information stored in a GDSII (GDS2), GL1, OASIS, or any other suitable format for storing such design structures). Design structure 2390 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 1-9. Design structure 2390 may then proceed to a stage 2395 where, for example, design structure 2390: proceeds to tape-out, is released to manufacturing, is released to a mask house, is sent to another design house, is sent back to the customer, etc.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:
1. A fin resistor, comprising:
a plurality of epitaxial semiconductor regions disposed on a substrate in series with a plurality of fins, arranged in an alternating pattern of epitaxial semiconductor regions and fins;
wherein a first epitaxial semiconductor region from the plurality of epitaxial semiconductor regions forms a first endpoint and a second epitaxial semiconductor region from the plurality of epitaxial semiconductor regions forms a second endpoint for the alternating pattern;

wherein each of the plurality of epitaxial semiconductor regions has a first resistance and each of the plurality of fins has a second resistance, wherein the first resistance is different than the second resistance;

wherein the plurality of epitaxial semiconductor regions have a dopant concentration ranging from about 1E20 atoms per cubic centimeter to about 2E21 atoms per cubic centimeter; and wherein the plurality of fins have a non-uniform dopant concentration profile, wherein a dopant concentration in an outer portion of each fin is higher than a dopant concentration in an interior portion of each fin.

2. The fin resistor of claim 1, wherein the substrate is an insulator layer, and wherein the substrate is disposed on a semiconductor layer.

3. The fin resistor of claim 1, further comprising a FinFET disposed on the substrate.

4. The fin resistor of claim 1, further comprising a gate material region disposed along the alternating pattern.

5. The fin resistor of claim 1, wherein the plurality of epitaxial semiconductor regions comprise silicon germanium.

6. The fin resistor of claim 1, wherein the plurality of epitaxial semiconductor regions and plurality of fins are doped with N-type dopants.

7. The fin resistor of claim 1, wherein the plurality of epitaxial semiconductor regions and plurality of fins are doped with P-type dopants.

8. The fin resistor of claim 1, further comprising a first contact formed on the first endpoint and a second contact formed on the second endpoint.

* * * * *